US012088064B2

United States Patent
Teissier et al.

(10) Patent No.: US 12,088,064 B2
(45) Date of Patent: Sep. 10, 2024

(54) REFLECTOR FOR VCSEL

(71) Applicant: II-VI Delaware, Inc., Wilmington, DE (US)

(72) Inventors: Jean Axel Edmond Teissier, Huningue (FR); Ludovic Maurice Emile Marigo, Albis (CH); Wilfried Maineult, Zurich (CH)

(73) Assignee: II-VI DELAWARE, INC., Wilmington, DE (US)

( * ) Notice: Subject to any disclaimer, the term of this patent is extended or adjusted under 35 U.S.C. 154(b) by 181 days.

(21) Appl. No.: 17/444,521

(22) Filed: Aug. 5, 2021

(65) Prior Publication Data

US 2023/0042910 A1 Feb. 9, 2023

(51) Int. Cl.
*H01S 5/183* (2006.01)
*H01S 5/34* (2006.01)

(52) U.S. Cl.
CPC ....... *H01S 5/18361* (2013.01); *H01S 5/18311* (2013.01); *H01S 5/34* (2013.01)

(58) Field of Classification Search
CPC ...................................... H01S 5/18386–18394
See application file for complete search history.

(56) References Cited

U.S. PATENT DOCUMENTS

| | | | |
|---|---|---|---|
| 6,785,320 B1* | 8/2004 | Amos | H01S 5/18355 372/102 |
| 2008/0037606 A1 | 2/2008 | Morgan et al. | |
| 2008/0247436 A1* | 10/2008 | Carter | H01S 5/0683 372/50.11 |
| 2015/0288145 A1* | 10/2015 | Fattal | H01S 5/18363 372/45.01 |
| 2018/0278023 A1 | 9/2018 | Na et al. | |
| 2021/0167580 A1 | 6/2021 | Qiao et al. | |

FOREIGN PATENT DOCUMENTS

| KR | 20120117032 A | 10/2012 |
|---|---|---|
| WO | 2020214097 A1 | 10/2020 |

* cited by examiner

*Primary Examiner* — Minsun O Harvey
*Assistant Examiner* — Stephen Sutton Kotter
(74) *Attorney, Agent, or Firm* — Blank Rome LLP

(57) ABSTRACT

A vertical cavity surface emitting laser (VCSEL) may include an active region (e.g., one or more quantum wells) and a chirped pattern reflector. The active region may be configured to be electrically pumped such that the active region generates light having a fundamental mode and a higher order mode. The chirped pattern reflector may include a first portion presenting to the active region as a first portion of an effective mirror having a concave shape and a second portion presenting to the active region as a second portion of the effective mirror having a convex shape.

17 Claims, 7 Drawing Sheets

REFLECTOR FOR VCSEL

BACKGROUND

Lasers are commonly used in many modern communication components for data transmission. One use that has become more common is the use of lasers in data networks. Lasers are used in many fiber optic communication systems to transmit digital data on a network. In one exemplary configuration, a laser may be modulated by digital data to produce an optical signal, including periods of light and dark output that represents a binary data stream. In actual practice, the lasers output a high optical output representing binary highs and a lower power optical output representing binary lows. To obtain quick reaction time, the laser is constantly on, but varies from a high optical output to a lower optical output.

One type of laser used in optical data transmission is a Vertical Cavity Surface Emitting Laser (VCSEL). In general, the VCSEL includes a top mirror, a bottom mirror, and a cavity therebetween. The cavity includes an active region.

The VCSEL can be used with external structures. For example, a High Contrast Grating (HCG) can be used with a VCSEL as a way to collimate the output beam or to ensure better current injection. Replacing a top mirror in a VCSEL by a HCG structure, which is thinner, can also reduce electrical resistance.

In other variations that can be used with a VCSEL, an external cavity having a curved mirror can be used with a VCSEL to shape the waveform. A VCSEL including such an external cavity may be described as a vertical external cavity surface emitting laser (VECSEL), The external cavity collimates the waveform and may achieve significantly higher single mode power for relatively larger aperture VECSEL devices. This is due to the curved external mirror that selects only the fundamental mode and decouples the mode shape from the current confinement aperture in first approximation. However, fabrication and control of such an external cavity is not straightforward for industrial applications.

The subject matter claimed herein is not limited to implementations that solve any disadvantages or that operate only in environments such as those described above. Rather, this background is only provided to illustrate one example technology area where some implementations described herein may be practiced.

SUMMARY

This Summary introduces a selection of concepts in a simplified form that are further described below in the Detailed Description. This Summary is not intended to identify key features or essential characteristics of the claimed subject matter, nor is it intended to be used as an aid in determining the scope of the claimed subject matter.

As disclosed herein, a vertical cavity surface emitting laser (VCSEL) includes an active region having one or more quantum wells, quantum dots, or the like and includes a chirped pattern reflector. The active region is configured to be electrically pumped such that the active region generates light having a fundamental lateral optical mode of the cavity, but also having some higher order modes. The chirped pattern reflector includes: a central portion structured to present a concave portion of an effective mirror to the active region, and an outer portion structured to present a convex portion of the effective mirror to the active region. In other words, the first portion of the chirped pattern reflector generates a concave reflected phase plan facing the active region, and the second portion generates a convex reflected phase plan facing the active region. The first portion of the chirped pattern reflector is configured to reflect the fundamental mode such that a stability of the fundamental mode is increased within the optical cavity. By contrast, the second portion of the chirped pattern reflector is configured to diverge the higher order mode.

Additional features and advantages will be set forth in the description which follows, and in part will be obvious from the description, or may be learned by practice. The features and advantages may be realized and obtained by means of the instruments and combinations particularly pointed out in the appended claims. These and other features will become more fully apparent from the following description and appended claims.

DETAILED DESCRIPTION

Figure 1A:
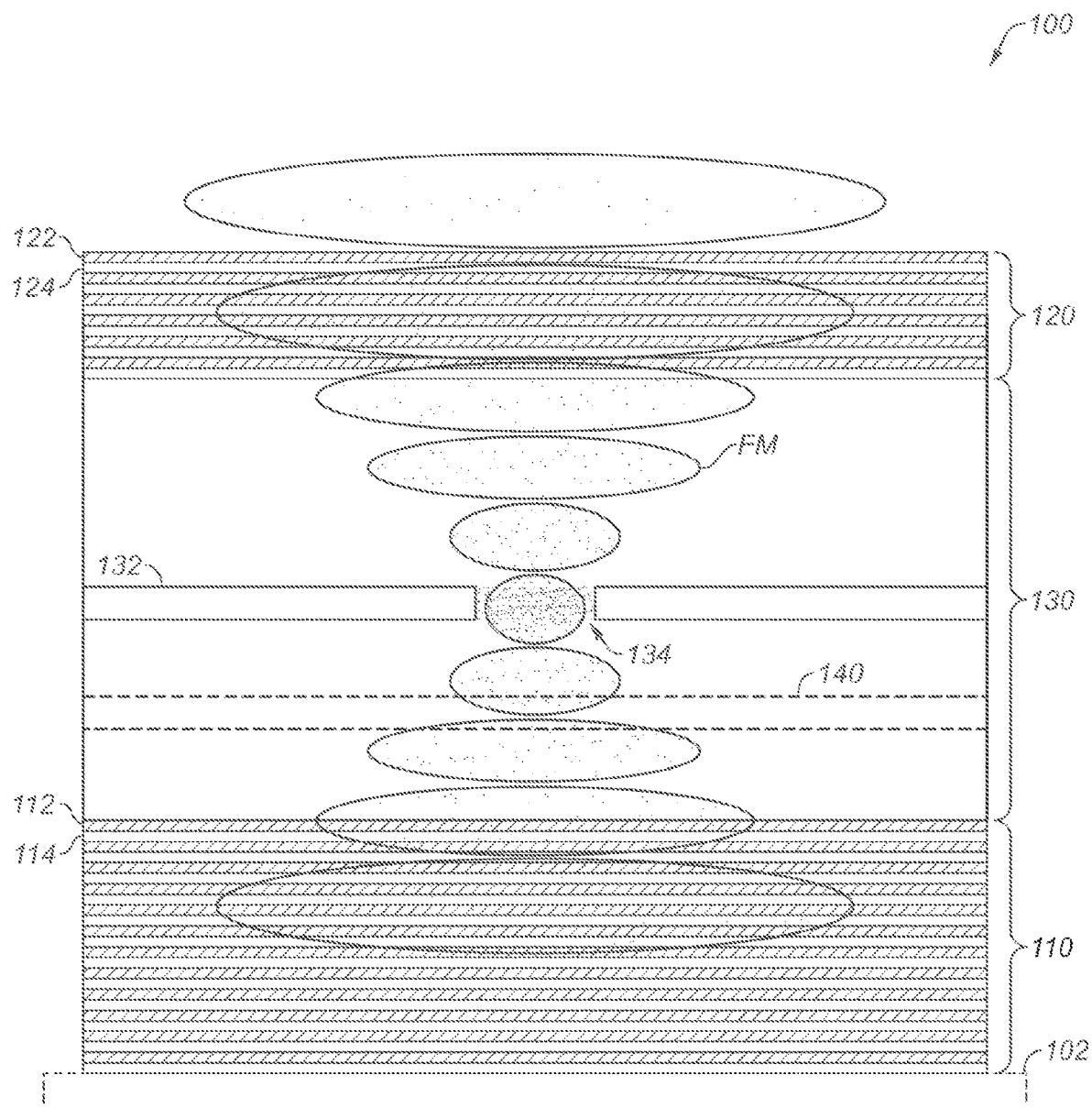
FIG. 1A illustrate a vertical cavity surface emitting laser (VCSEL) according to a conventional arrangement.

FIG. 1A illustrates a vertical cavity surface emitting laser (VCSEL) 100 according to a conventional arrangement. As its name implies, the vertical cavity surface emitting laser (VCSEL) 100 has a laser cavity 130 that is sandwiched between and defined by two mirrors 110, 120. The VCSEL 100 is typically constructed on a semiconductor wafer (not shown), such as Gallium Arsenide (GaAs). The VCSEL 100 includes a bottom mirror 110 constructed on the semiconductor wafer. Typically, the bottom mirror 110 includes a number of alternating high and low index of refraction layers 112, 114. For instance, the bottom mirror 110 may include a Bragg mirror, which includes a stack of thin planar layers 112, 114 of alternating optical refractive indices. Each interface of the layers 112, 114 may provide a small reflection, as indicated by the Snell-Descartes law. As light passes from a layer of one index of refraction to another, a portion of the light is reflected.

By using a sufficient number of alternating layers 112, 114, a high percentage of light can be reflected by the mirror 110. The thickness of the layers 112, 114 may be tuned to enhance reflection at a particular wavelength, for a particular wavelength range, or for multiple wavelength ranges. If the wavelength of the light and the periodicity of the Bragg grating are not sufficiently matched, interference buildup may be hindered, depending on the mismatch. For example, an associated output beam may be de-phased relative to a configuration with a sufficiently matched wavelength of the light and periodicity of the Bragg grating.

An active region 140 that includes a number of quantum wells, quantum dots, or the like is formed above the bottom mirror 110. The active region 140 forms a PN junction sandwiched between the bottom mirror 110 and the top mirror 120. The notion of top and bottom mirrors 110, 120 is somewhat arbitrary. In some configurations, light could be extracted from the wafer substrate 102 of the VCSEL 110 on which the mirror 110 is mounted, with the "top" mirror 120 almost totally reflective and thus opaque. However, for purposes of this description, the "top" mirror 120 may refer to the mirror from which light is to be extracted, regardless of how it is disposed in the physical structure.

Carriers in the form of holes and electrons are injected into the quantum wells of the active region 140 when the PN junction is forward biased by an electrical current. At a sufficiently high bias current, the injected minority carriers form a population inversion in the quantum wells of the active region 140 that produces optical gain. Optical gain occurs when electrons in the conduction band recombine with holes in the valence band. When the optical gain acquired during a round trip in the cavity 130 is equal to the round trip optical losses (including equivalent mirror losses due to photon escape), laser oscillation occurs.

The active region 130 may also include an oxide aperture 134 formed using one or more oxide layers 132. The oxide aperture 132 serves both to form an optical cavity and to direct the electrical carriers through the central region of the cavity 130 that is formed. Alternatively, other means, such as ion implantation, epitaxial regrowth after patterning, or other lithographic patterning may be used to perform these functions.

The top mirror 120 is formed above the active region 140. The top mirror 120 is similar to the bottom mirror 110 in that it may include a number of layers 122, 124 that alternate between a high index of refraction and a lower index of refraction. Generally, the top mirror 120 may have fewer mirror periods of alternating refraction layers 112, 114 to facilitate light emission from the top of the VCSEL 100 in the context of a top emitting device.

Illustratively, the VCSEL 100 functions when a current is passed through the PN junction to inject carriers into the active region 140. Recombination of the injected carriers from the conduction band to the valence band in the quantum wells in the active region 140 results in photons that begin to travel in the laser cavity 130 defined by the mirrors 110, 120. The mirrors 110, 120 reflect the photons back and forth. When the bias current is sufficient to produce a population inversion between the quantum well states at the wavelength supported by the cavity 130, optical gain is produced in the quantum wells in the active region 140. When the optical gain is equal to the cavity loss, laser oscillation occurs, the laser 110 is said to be at threshold bias, and the VCSEL 100 begins to lase as the optically coherent photons are emitted from the top of the VCSEL 100, instance, the top mirror 120 and the bottom mirror 110 may cause light, after propagation, to periodically come back to its initial wavevector, which may lead to interference buildup of power inside the cavity 130. The cavity 130 may generally support a discrete number of so-called cavity modes for a given wavelength. Incoming light may build up within the cavity 130 due to constructive interference and may leak from the cavity 130.

The cavity 130 bounded by the mirrors 110, 120 that are formed by Bragg reflectors may be described as 1-D photonic crystal, invariant per translation along the substrate 102. Cavity modes may be determined by accounting for inference buildup from reflection at the material interfaces.

The cavity 130 of the VCSEL 100 may be a 1-D photonic crystal, neglecting the controlled oxidation. The light emitted from the quantum wells of the active region 140 may be coupled directly into the surrounding cavity 130.

Generally, there may be a correlation between a surface area of the electrically pumped quantum well layers of the VCSEL's active region 140 and a maximum optical power emitted by the VCSEL 100. Changing the electrically pumped surfaced area of the quantum layers in the active region 140 may generally be obtained by altering a width or diameter of a current confinement aperture 134 defined by an isolation layer 132. In some instances, the isolation layer 132 and the current confinement aperture 134 may be formed via lateral oxidation of a high-aluminum layer relatively close to the quantum well layer(s) of the active region 140. For instance, the high-aluminum layer may include $Al_xGA_{1-x}$, where x>0.98. Alternately, the aperture 134 may be formed via other techniques, such as proton implantation, for example.

Increasing the surface area of the electrically pumped quantum well layer(s) of the active region 140 may increase a maximal power of the light emitted from the VCSEL 100. However, the single mode power may be limited, as the power where the VCSEL 100 operates in the multimode regime is reduced. This is the result of several physical effects, from mode competition to spatial hole burning and gain clamping.

For light emission having a wavelength of about 940 nanometers (nm) in air, current confinement apertures 134 may have a diameter of about 5 micrometers (μm) to facilitate single transverse mode confinement. This may be employed to create what may be described as a single mode VCSEL 100. Such a single mode VCSEL 100 may be polarization degenerated. The relatively small width aperture 134 may result in the VCSEL 100 having a relatively low maximal power. For example, the VCSEL 100 having an aperture 134 with a diameter of about 5 μm may have a maximal single fundamental mode power lower than about 5 milliwatts (mW).

Larger current confinement apertures 134 may facilitate multiple transverse optical modes from the VCSEL 100. Such a VCSEL 100 may be described as a Multimode (Transverse) VCSEL. The larger current confinement aperture 134 of the Multimode (Transverse) VCSEL may facilitate a current spread into the VCSEL structure in a manner that facilitates relatively higher power. The larger current confinement aperture 134 of the Multimode (Transverse) VCSEL 100 may lower resistive loses, lower thermal heating, and lower spatial gain saturation.

Apart from the thin lateral oxidation layer 132, which defines the aperture 134, the VCSEL 100 may be, in first approximation, a gain guided laser. For example, the optical modes of the VCSEL 100 may not be confined by index guiding, but instead by the localization of the gain, thermal heating, and losses.

In some configurations, the aperture 134 may be circular in shape. A cavity mode of the VCSEL 100 may include a quasi-circular diverging mode having a waist generally close to the aperture 134 of the lateral oxidation layer 132, which is located adjacent where electrically pumped quantum wells or the like of the active region 140. The lateral oxidation layer 132 may be located above or below the active region 140 having the quantum wells. In some configurations, an additional lateral oxidation layer may be present. Both lateral oxidation layers 132 may be located above the active region 140 of the quantum well layers, below the active region 140 of the quantum well layers, or may be located on either side of the active region 140 of the quantum well layers such that the quantum wells may be located between two lateral oxidation layers 132.

The optical cavity 130 of the VCSEL 100 may be described as a flat-flat degenerated Fabry-Perot cavity. In other words, the optical cavity 130 is defined by the top distributed Bragg reflector (DBR) 120 and the bottom DBR 110. The DBRs 110, 120 are formed from alternating high and low index of refraction layers 112, 122 and 114, 124. The DBRs 110, 120 can be monolithically grown by epitaxy, such as molecular beam epitaxy (MBE) or molecular organic vapor phase epitaxy (MOVPE). As a result, the DBRs 110, 120 have nearly infinite radiuses of curvature. That is, the DBRs 110, 120 are nearly flat and have a same shape as a substrate wafer 102 on which the bottom DBR 110 is typically formed. The fundamental mode of this conventional VCSEL 100 is shaped by gain guiding, thermal lensing, and birefringence, but not by the reflectivity of the top DBR 120, because the VCSEL 100 has a flat-flat Fabry-Perot cavity 130.

Figure 1B:
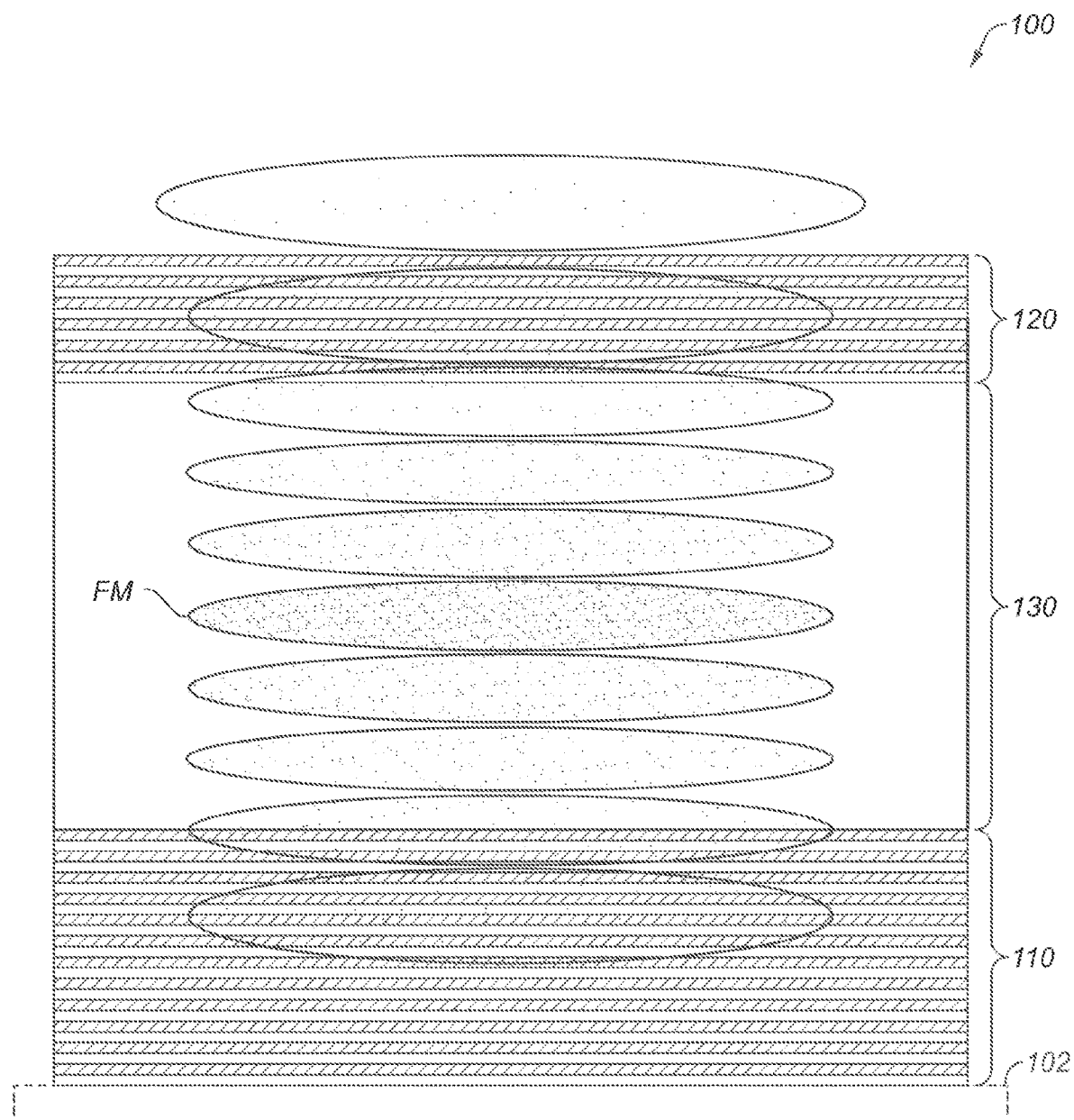
FIG. 1B illustrates the conventional VCSEL of FIG. 1A, showing an associated fundamental lateral mode in the VCSEL cavity.

FIG. 1B is a diagrammatic illustration of the conventional VCSEL 100 of FIG. 1A and shows an associated example of the fundamental mode 116. Again, the fundamental mode 116 may be shaped, for example, by gain guiding, thermal lensing, and birefringence. The fundamental mode 116 of the VCSEL 100 is not shaped by the reflectivity of the top DBR 120 because the optical cavity 130 is a flat-flat Fabry-Perot cavity 130 as noted previously. Accordingly, the fundamental mode 116 may be unstable.

Figure 2:
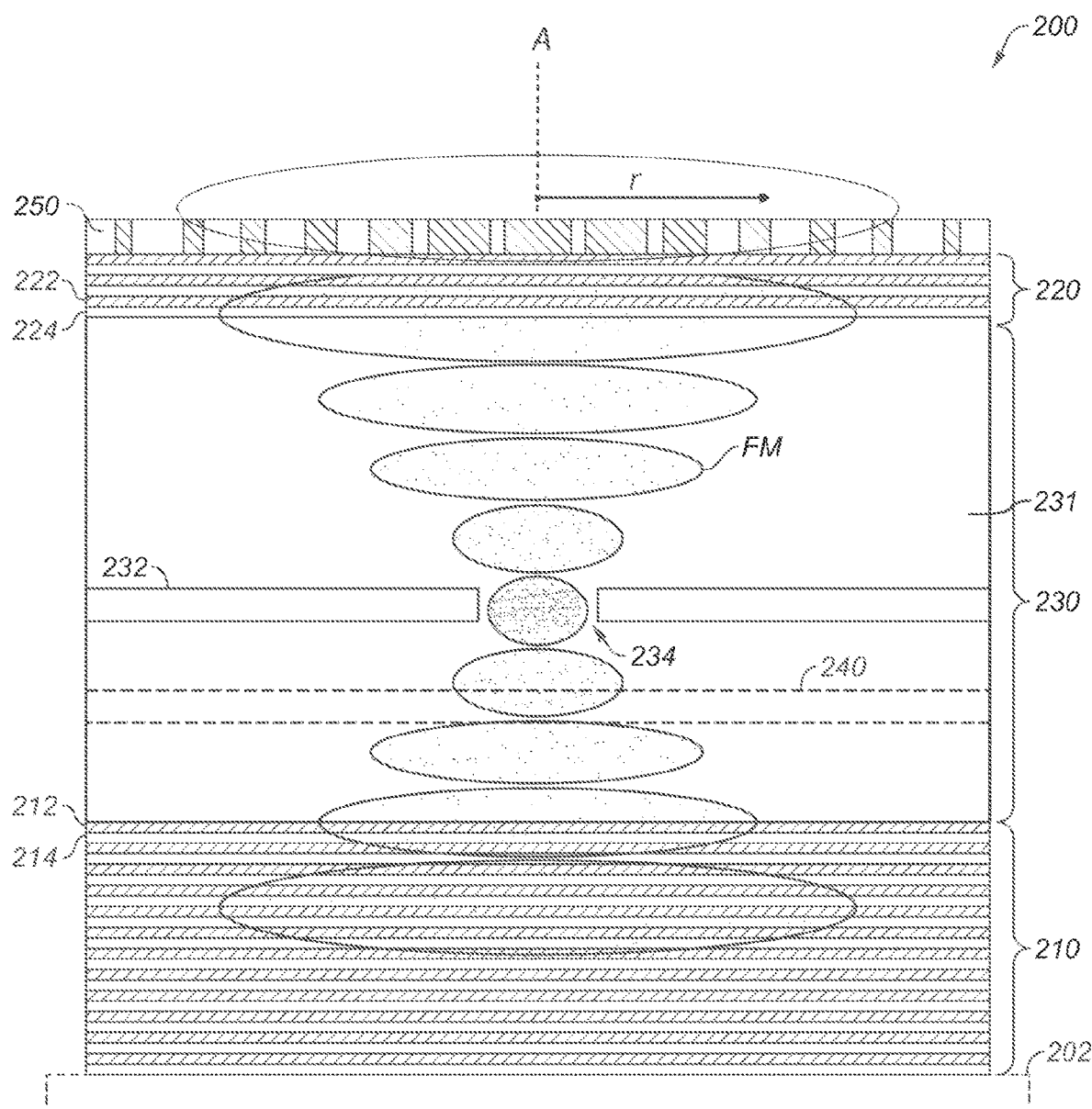
FIG. 2 illustrates a VCSEL having a chirped pattern reflector according to the present disclosure.

According to the present disclosure, however, a patterned structuration used for a reflector on a VCSEL can provide good reflectivity and can shape the waveform in advantageous ways. In particular, FIG. 2 illustrates a VCSEL 200 having a reflector 250 with a patterned structuration according to the present disclosure.

The VCSEL 200 can share various features and details of a conventional arrangement for a VCSEL, such as discussed above with reference to FIGS. 1A-1B. For example, the VCSEL 200 can be surface emitting as shown, but it can be bottom emitting. A bottom DBR 210 may be formed on a substrate 202 and may generally correspond to a bottom DBR, as noted in FIGS. 1A-1B. An optical cavity 230 is formed on the bottom DBR 210 and includes an active regions 240. In general, the optical cavity 230 includes confinement layers 231 that bound the active region 240.

As also shown, for example, the VCSEL 200 can include an insulating layer (e.g., a lateral oxidation layer) 232 defining a current confinement aperture 234. In some configurations, the aperture 234 may have a width or diameter relatively larger than used in a conventional VCSEL such that a relatively larger area of an associated quantum well layer of the active region 240 may be electrically pumped. For example, in some embodiments, the current confinement aperture 234 may have a width or diameter greater than 5 µm.

In some general observations, the chirped pattern reflector 250 may be monolithically gown as an integrated layer that is then structured and can use dielectric deposited material(s) or semiconductor layer(s). This integrated layer can be formed on a confinement layer 231 of the optical cavity 230 or can be formed on (or as part of) a Distributed Bragg reflector. The chirped pattern reflector 250 may also be an air-gap flat reflector disposed at an air gap distance from the active region 240 and other portions of the VCSEL 200. The subsequent structuration (in shape, size and pattern) depends on the reflector type.

As shown here, the chirped pattern reflector 250 can be used in conjunction with layers of a Distributed Bragg reflector (DBR) 220 to increase the top-mirror's reflectivity. The chirped pattern reflector 250 can be configured to have a different reflectivity as a function of the polarization of the mode with respect to the orientation of the pattern. This makes the VCSEL 200 polarized, and therefore purely single mode.

The chirped pattern reflector 250 can be engineered to break rotation invariance, providing a different reflectivity or effective refractive index between the different TE polarization. This creates a pure single mode laser or ensures a stable bimodal VCSEL, with a fixed and control detuning between the two TE polarization. The purpose of this is to perform Angular Orbital Momentum (AOM) or "Spin-polarized" data transmission at a rate fixed by the detuning between the two cross-polarized optical modes.

The chirped pattern reflector 250 can either be integrated inside the VCSEL 200 as shown in FIG. 2 at the VCSEL's surface or can be integrated on another support (not shown) for the VCSEL 200. The shape of the chirped pattern reflector 250 can be either made out of concentric parts (r<r0, r>r0), or of another shape, such as an ellipsoid, or can be made out of a simple 1-D implementation (x<x0, x>x0).

In general, the patterned structuration of the reflector 250 can take the form of a high contrast grating, a 0-D photonic crystal, or "flat" meta-reflector. Overall, the reflector 250 with the patterned structuration can either be deposited or etched into the VCSEL's epitaxial structure. As discussed below, this structuration provides the VCSEL 200 with better single mode reflectivity, as opposed to being engineered like a conventional grating used for tuning a wavelength of a single mode VCSEL.

In some embodiments of the present disclosure, for instance, such as illustrated in FIG. 2, the top DBR 220 includes the reflector 250 having the patterned structuration in the form of a chirped pattern grating, which may include a two-dimensional layer having a periodic pattern that may create an out-of-plane reflectivity. By chirping the pattern in spacing, occupation factor, or thickness, a reflected wavefront may be curved such that the reflector 250 may act as an equivalent of a curved mirror (i.e., an effective mirror as described herein). For the purposes of discussion, the reflector 250 having the patterned structuration is referred to as a chirped pattern reflector.

The optical cavity 230 between the bottom DBR 210 and the chirped pattern reflector 250 may be described as a 2-D photonic crystal bounded by the 2-D reflector of the chirped pattern reflector 250. In some configurations, the 2-D chirped pattern reflector 250 has some aspect of rotational symmetry.

The 2-D photonic crystal produced by the chirped pattern reflector 250 may support a set of discrete modes at a particular wavelength. These modes may be externally excited under particular conditions. External light may be coupled to the cavity 230, reflected by the 2-D reflectors, and outcoupled. If the wavelength and the 2-D photonic crystal are not particularly matched, intensity of reflection may be somewhat smaller and reflected beams may acquire dephasing compared to a case where the wavelength and the 2-D photonic crystal are particularly matched.

Figure 4A:
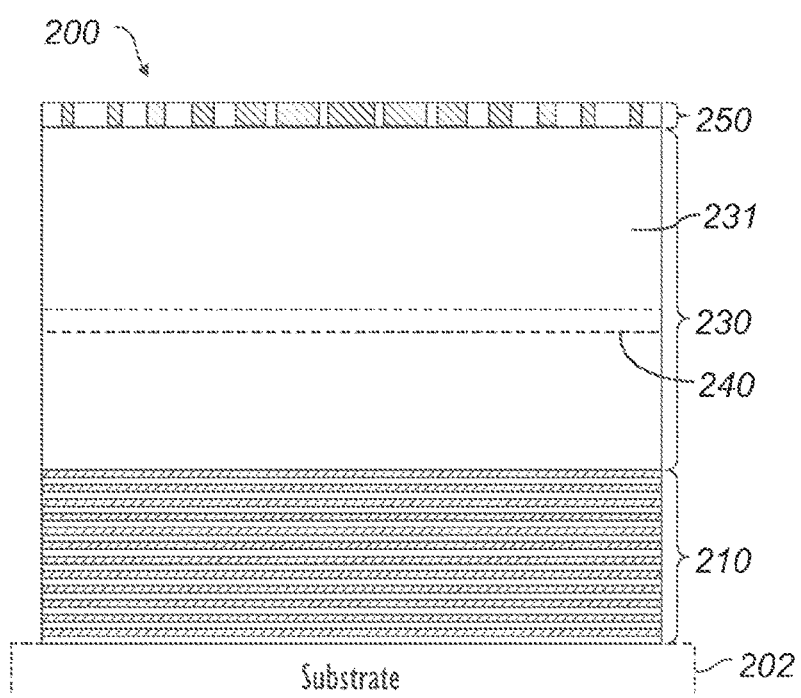
FIGS. 4A-4C illustrate a VCSEL having other arrangements of chirped pattern reflector according to the present disclosure.
Figure 4B:
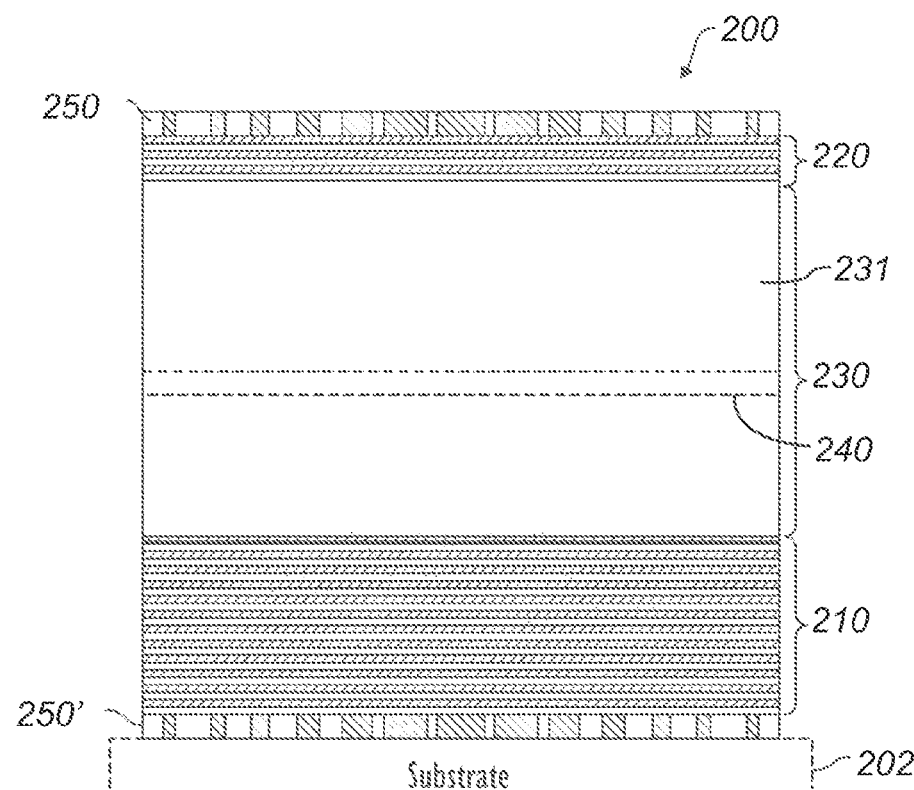

The chirped pattern reflector 250 may be formed with (or on) the top mirror 220, which includes patterned layers 222, 224 of two materials having a high difference in refractive indexes, The chirped pattern reflector 250 may generally be the outcoupling mirror of the VCSEL 200. The bottom DBR 210 may alternately or additionally be replaced by a chirped pattern reflector generally corresponding to the chirped pattern reflector 250. For example, FIG. 4A illustrates a VCSEL 200 having a chirped pattern reflector 250 according to the present disclosure disposed on (formed on) a confinement layer of the cavity 230, which has the active region 240. In another example, FIG. 4B illustrates a VCSEL 200 having chirped pattern reflectors 250, 250' according to the present disclosure used in conjunction with top and bottom DBRs 220, 230 that bound the cavity 230, which has the active region 240.

Figure 4C:
Figure 4C:
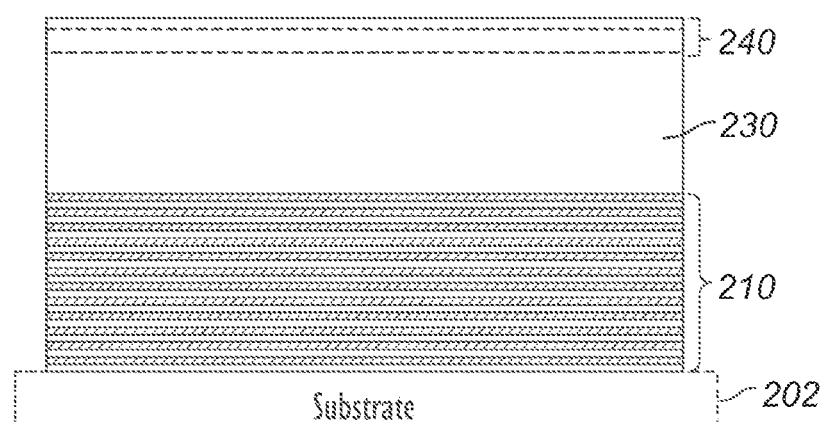

In yet another example noted previously, FIG. 4C illustrates a VCSEL 200 having a chirped pattern reflector 250" according to the present disclosure configured as a flat air-gap reflector and used in conjunction with a bottom DBR 230 to bound the cavity 230, which has the active region 240. For this VCSEL 200, the chirped pattern reflector 250" can be fabricated on a semiconductor layer grown within an epitaxial system. The chirped pattern of can be patterned onto the layer using lithography and etching steps. Wet etching can then remove a sacrificial layer so that the chirped pattern reflector 250" is supported at an air gap from the active region 240. Structures that would support the reflector 250" are not shown in FIG. 4C, but would be appreciated by one skilled in the art.

As these examples illustrate, other variations are possible, such as the cavity 230 being bounded by top and bottom chirped pattern reflectors 250, 250' without top and bottom DBRs, the cavity 230 being bounded on one side by a top chirped pattern reflector 250 and top DBR 220 and bounded on the other sided by a bottom chirped pattern reflector 250' without a bottom DBR, etc. As will be appreciated, conventional features (e.g., mesas, contacts, etc.) associated with a VCSEL are not illustrated in the figures presented herein, but such features would be present in an implementation of the disclosed VCSELs.

Returning to FIG. 2, the thickness and the patterning for the chirped pattern reflector 250 may serve to couple incoming light, which may be perpendicular to the layer, into light travelling in the layer plane. This coupling may be relatively efficient, as the contrast may be high and the losses in the materials may be low. Furthermore, the thickness and the patterning for the chirped pattern reflector 250 may act as a 2-D photonic crystal for the light travelling inside the reflector 250, or confining a mode. That is, the grating of the chirped pattern reflector 250 may couple light into the 2-D photonic crystal, which may bounce it back and reflect in the original propagation direction.

In some configurations, the portions of the VCSEL 200 discussed herein may be circularly symmetric about an axis A of symmetry that may run through the centers of the chirped pattern reflector 250, the fundamental mode FM, the higher order mode HM, and the bottom DBR 210 as illustrated in FIGS. 2 and 3A-3C. The chirped pattern reflector 250 in FIG. 2 is merely schematically depicted. The actual pattern, spacing, thickness, and the like will differ and will depend on the particular implementation.

In some embodiments, the chirped pattern reflector 250 in the form of a metasurface or a high contrast grating may be used in place of (or in addition to) the top mirror 220. For instance, by chirping and engineering the periodicity of the two-dimensional reflector 250, the reflector 250 may generate a reflected beam having intensity and/or phase modulated spatially as a function of the incidence point on the reflector 250. This may produce a spatially varying phase of the reflected light, which may be similar to that produced by a lens. A metasurface for the chirped pattern reflector 250 designed with the purpose of having a high reflectivity can be designed to shape the reflected wavefront to create concave portion, a convex portion, or both portions of an effective mirror.

As shown in FIG. 2, the top mirror 220 includes the chirped pattern reflector 250 in the form of a chirped grating. The chirped pattern reflector 250 has a periodic structure that couples incident light with output beams of defined wavevectors due to the buildup of constructive interference for the wavevectors. Quasiperiodic structures, as may be present in some embodiments of the chirped pattern reflector 250, may similarly couple incident light with output beams of defined wavevectors where interference buildup is maintained. For instance, the top mirror 220 may include a patterned or structured layer of different refractive indexes. Spacings, sizes, and shapes of patterned elements of the chirped pattern reflector 250 may curve the reflected wavefront, engineer a specific reflection spectra, and have some different physical properties depending of the light's polarization. In some configurations, the top mirror 220 may include a combination of a number of layers 222, 224 that alternate between a high index of refraction and a lower index of refraction, as well as the structured metasurface (i.e., chirped pattern reflector 250) in addition to the alternating layers 222, 224. Such a configuration may encourage reflectivity as well as a desired phase curvature.

The chirped pattern reflector 250 disclosed herein provides mode stability to a curved wavefront at a flat reflector interface of the VCSEL 200. In some embodiments, a 2-D curved reflector 250 may be combined with a mode selector, which may lower a quality factor of unwanted transverse optical modes relative to a quality of one or more desired optical modes. In some configurations, the chirped pattern reflector 250 can be implemented as a high contrast grating chirped to curve the frontwave to increase a quality factor of a particular mode and may be combined with a second high contrast grating chirped to decrease a quality factor of other competing modes. Mass fabrication of such a structure may be relatively easier than mass fabrication of external cavities.

The chirped pattern reflector 250 may be formed from high refractive index layers 222 on top of a lower refractive index layers 224. In some configurations, the chirped pattern reflector 250 may be embedded into another material. The chirped pattern reflector 250 may be created starting from a 1-D or 2-D pattern that provides a relatively high reflectivity at a normal incidence. The chirped pattern reflector 250 may include a pattern designed to create spatially varied phase retardation of an incoming wavefront. In some embodiments, the pattern may be designed and created by reducing a width or scale of the patterned elements fabricated from the high refractive index layers such that an effective refractive index is lowered.

In some embodiments, abrupt jumps in phase may be implemented in the chirped pattern reflector 250. Alternatively, the pattern reflector may chirp slowly in shape, size, or spacing. Abrupt changes in shape, size, or spacing may be used, for instance, to ease the process fabrication. In some embodiments, a filling factor of the chirped pattern reflector 250 may be between 0.1 and 0.9, inclusive.

Beyond a particular radial expansion, the reflectivity of the chirped pattern reflector 250 may be lowered to a minimum, with an out of phase reflectivity. Alternately, the phase retardation may be determined such that the phase retardation is inverted. In some configurations, the radial expansion may not be homogeneous across the VCSEL 200 or may not be angle dependent.

In some embodiments, the chirped pattern reflector 250 may be composed of several elements. The size and shape of such elements may be varied to create a desired diffraction pattern of the chirped pattern reflector 250 and to facilitate development of a desired reflected wavefront from the chirped pattern reflector 250. The diffraction pattern may be associated with a designed change of thickness of the chirped pattern reflector 250 across the pattern of the chirped pattern reflector 250.

Figure 3A:
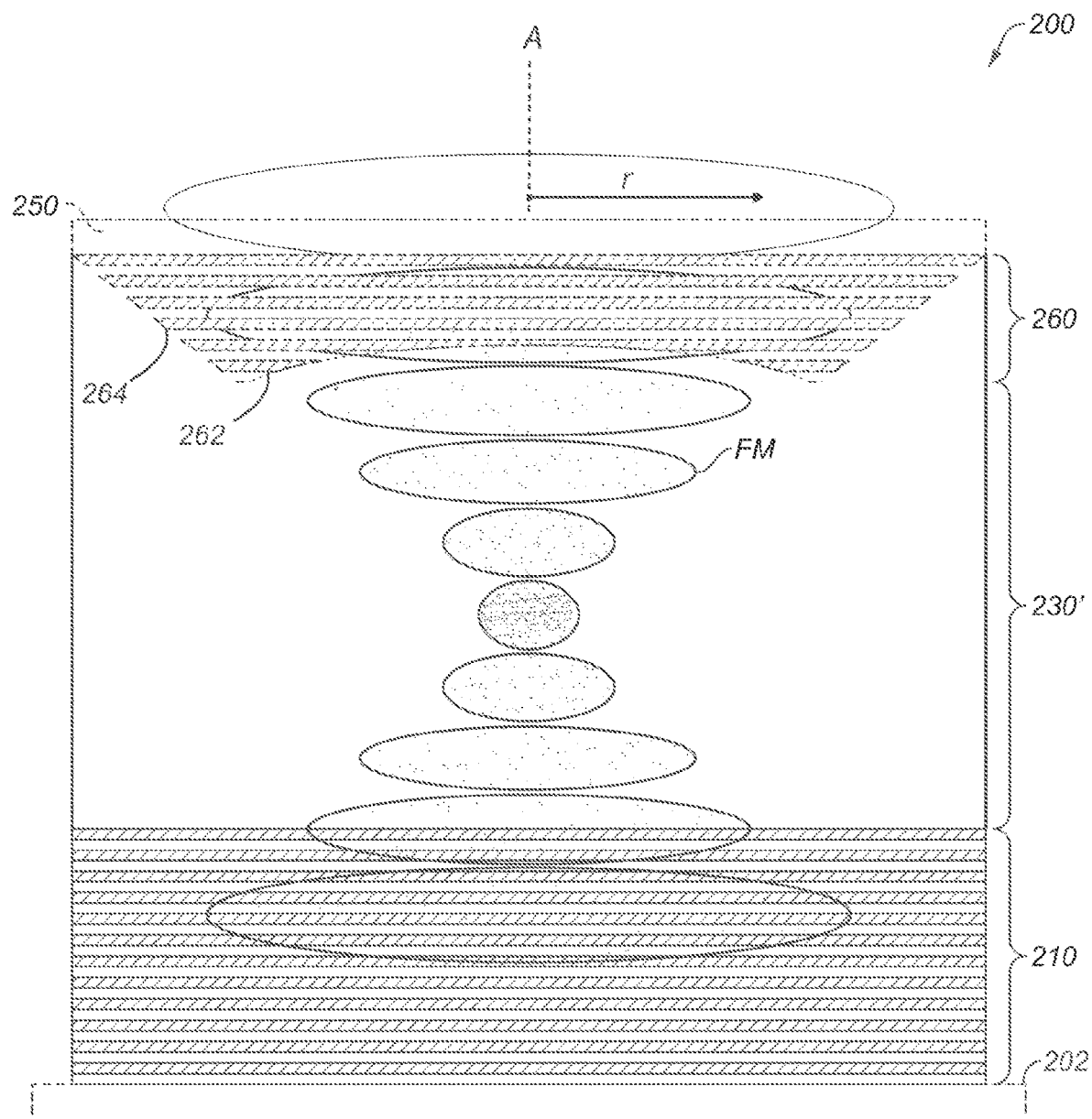
FIG. 3A illustrates a schematic of the disclosed VCSEL schematically showing an effective mirror and an associated fundamental mode.
Figure 3B:
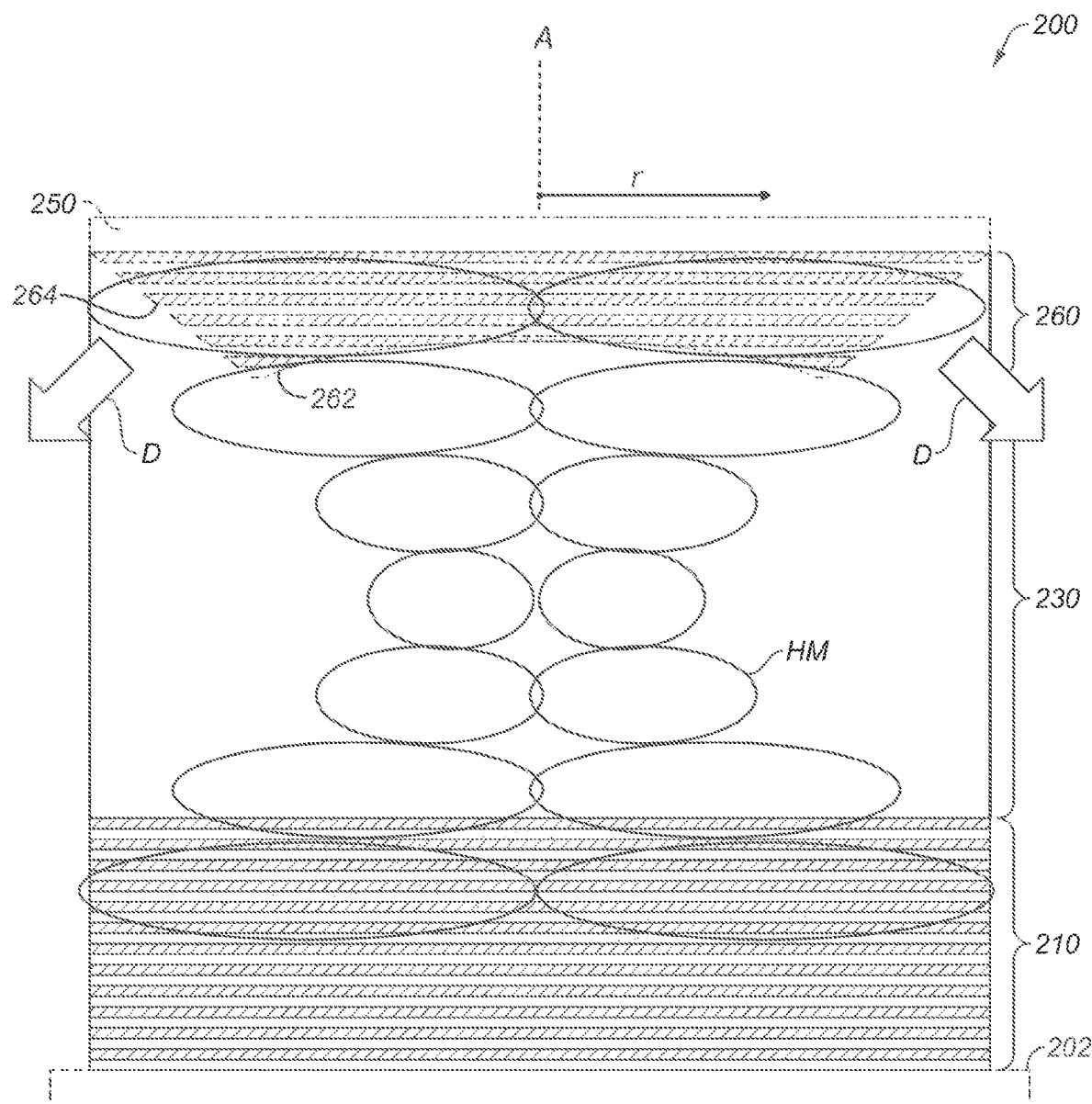
FIG. 3B illustrates a schematic of the disclosed VCSEL, schematically showing the effective mirror and an associated higher order mode.
Figure 3C:
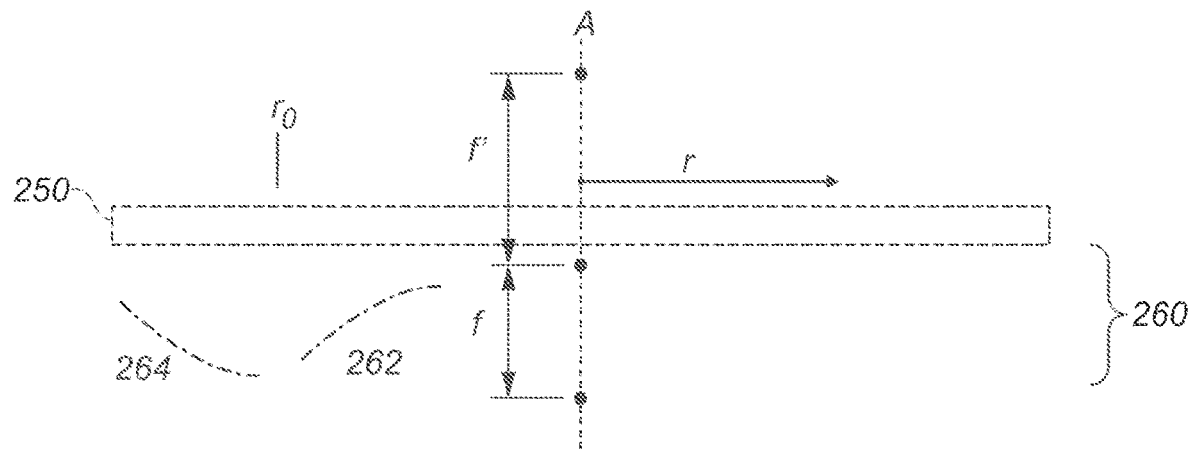
FIG. 3C illustrates schematic details of the effective mirror produced by the chirped pattern reflector.

As mentioned briefly above, the chirped pattern reflector 250 produces an effective mirror. FIGS. 3A-3C schematically show an effective mirror 260 for convenience in demonstrating some embodiments of the present disclosure. The chirped pattern reflector 250 produces the effective mirror 260, which has an equivalent mirror shape presented to the light of the optical cavity 230. As will be appreciated, the effective mirror 260 is not actually formed within the VCSEL 200 because it is produced at least in part by the reflected phase plan of the chirped pattern reflector 250 facing the optical cavity 230. For illustration, the reflector 250 is only schematically outlined in FIGS. 3A-3C, and the lateral oxidation layer 232 and the active region 240 are not shown.

FIG. 3A diagrams the VCSEL 200 with an associated fundamental mode FM, and FIG. 3B diagrams the VCSEL 200 with an associated higher order mode FM. In general, the fundamental mode FM may represent a single desired mode or multiple desired modes, but is described herein as the fundamental mode FM for convenience and clarity. The configuration of the chirped pattern reflector 250 results in a reflectivity represented by the effective mirror 260, schematically illustrated in FIGS. 3A-3B.

As shown by way of example in FIGS. 3A-3B, the effective mirror 260 has concave and convex portions, which interact with the fundamental mode FM and any higher modes HM in different ways. The chirped pattern reflector 250 (with the effective mirror 260 that it presents to the cavity 230) is configured to exhibit phase retardation given by:

$$\text{For } r < r0: \Phi(r) = \frac{2\pi}{\lambda}\left(f + \frac{\lambda}{2\pi}\Phi_{Max} - \sqrt{r^2 + f^2}\right) \text{Modulo } 2\pi$$

$$\text{For } r > r0: \Phi(r) = \frac{2\pi}{\lambda}\left(-f' + \frac{\lambda}{2\pi}\Phi_{Max} - \sqrt{r^2 + f'^2}\right) \text{Modulo } 2\pi$$

In the above equations and as shown more schematically in FIG. 3C, the variable r represents a radius or a distance from the axis A of symmetry of the VCSEL 200. In the above equations, Φ(r) represents the phase retardation to be implemented for the given radius r. The variable r0 represents a given radius where there is a change in the "curvature" of the effective mirror 260. The variable $\Phi_{Max}$ represents a maximal phase retardation, which may be the phase retardation at the axis A of symmetry. The variable f represents a focal length of the concave portion 262 of the effective mirror 260. The variable f' represents a focal length of the convex portion 264 of the effective mirror 260. The variable λ represents the wavelength of the fundamental mode FM in a vacuum. In general, the concave focal length f is on the order of 1 μm to 650 μm, inclusive. Alternately or additionally, the convex focal length f' may be selected to facilitate mode selectivity. In general, the convex focal length f' may be on the order of 1 μm to 650 μm, inclusive. The larger focal lengths f and f' would tend to apply to implementations in which a chirped reflector is disposed toward the substrate side of the VCSEL 200. In one example, the focal length f of the concave portion can be equal to or greater than 5 μm and equal to or less than 20 μm. Also as an example, the focal length f' of the convex portion is equal to or greater than 10 μm and equal to or less than 100 μm.

As noted previously, the chirped pattern reflector 250 may be formed at least in part by a chirped meta-mirror, such as a high contrast grating, to promote a curvature of a reflected wavefront. With respect to the fundamental mode FM in FIG. 3A, the chirped pattern reflector 250 and the bottom DBR 210 form a stable plano-concave optical cavity 230 for desired modes. The chirped pattern reflector 250 reflects and adds a spatially varying phase to a wavefront of the VCSEL 200. The chirped pattern reflector 250 presents an equivalent of a concave mirror 262 to the fundamental mode FM as indicated by the effective mirror 260 in FIGS. 3A-3C. In other words, a central portion of the chirped pattern reflector 250 generates a concave reflected phase plan 262 facing the optical cavity 230 with its active region (240).

For instance, the chirped pattern reflector 250 decouples, in a first approximation, an optical mode shape from a diameter of the aperture (234: FIG. 2) of the lateral oxidation layer (232). The fundamental mode FM can be reflected by the chirped pattern reflector 250 such that stability of the fundamental mode FM is improved within the optical cavity 230. Such improved stability can increase a quality factor of the fundamental mode FM and may promote improved electro-optic performance of the VCSEL 200 relative to a conventional VCSEL having a flat-flat optical cavity. In some embodiments, the fundamental mode FM may be defined in the first order by the plano-concave optical cavity 230, even in configurations that omit a gain guiding structure from the VCSEL 200.

With respect to the higher order mode HM, FIG. 3B shows the VCSEL 200 with an associated higher order mode HM relative to the effective mirror 260 produced by the chirped pattern reflector 250 disclosed above. The higher order mode HM may represent a single undesired mode or multiple undesired modes but is described herein as the higher order mode HM for convenience and clarity.

A spatially varying phase of the chirped pattern reflector 250 may be positioned such that the higher order mode HM may interact with the chirped pattern reflector 250 at a portion that presents an equivalent of a convex portion 264 of a mirror, as indicated by the effective mirror 260. In other words, a peripheral portion of the chirped pattern reflector 250 generates a convex reflected phase plan 264 facing the optical cavity 230 with its active region (240). The convex portion 264 may present to the higher order mode HM as a convex reflector with the addition of the shape of the portions of the chirped pattern reflector 250 outside of the concave portion 262. This interaction with the convex portion 264 may subject the higher order mode HM to divergence D of the higher order mode HM. For example, the chirped pattern reflector 250 may lower a quality factor of the higher order mode HM and may result in relatively higher loses than the fundamental mode FM. The portion of the chirped pattern reflector 250 that presents an equivalent of a convex portion 264 of the effective mirror 260 may have limited to no impact on the fundamental mode FM.

As disclosed, the effective mirror 260 produced may be shaped as in FIGS. 3A-3C to promote stability of the fundamental mode FM and to diverge higher order modes HM. As will be appreciated, the chirped pattern reflector 250 may not produce an effective mirror 260 as in FIGS. 3A-3C, but may be otherwise shaped. In other words, the chirped pattern reflector 250 can present an equivalent shape to the fundamental mode FM that is different from a concave mirror illustrated in FIGS. 3A-3C. For example, the chirped pattern reflector 250 may present an alternate shape that may create an optically stable cavity for the fundamental mode FM or for any combination of desired modes, including polarization selected modes.

The described aspects are in all respects illustrative and not restrictive. The claimed subject matter is indicated by the appended claims rather than by the foregoing description. All changes which come within the meaning and range of equivalency of the claims are to be embraced within the scope of the claims.

What is claimed is:

1. A vertical cavity surface emitting laser (VCSEL) comprising:
an active region configured to be electrically pumped to generate light having a fundamental mode and a higher order mode;
a first reflector disposed adjacent one side of the active region, the first reflector comprising a plurality of parts concentrically arranged around an axis of symmetry A of the VCSEL, each concentric part having a spatial variation that changes at distances from the axis of symmetry A, the concentric parts configured to exhibit a phase retardation Φ as a function of a radius r from the axis of symmetry A, wherein:
within a radius r0 of the axis of symmetry A, the concentric parts are structured to present a concave portion of an effective mirror to the active region and exhibit a phase retardation Φ(r) given by $$\Phi(r) = \frac{2\pi}{\lambda}\left(f + \frac{\lambda}{2\pi}\Phi_{Max} - \sqrt{r^2 + f^2}\right) \text{Mod } 2\pi, \text{ and}$$

outside the radius r0 from the axis of symmetry A, the concentric parts are structured to present a convex portion of the effective mirror to the active region and exhibit a phase retardation Φ(r) given by $$\Phi(r) = \frac{2\pi}{\lambda}\left(-f' + \frac{\lambda}{2\pi}\Phi_{Max} - \sqrt{r^2 + f'^2}\right) \text{Mod } 2\pi; \text{ and}$$

a second reflector disposed adjacent another side of the active region opposite the first reflector, where:
λ represents a wavelength of the fundamental mode in a vacuum;
f represents a focal length of the concave portion of the effective mirror;
f' represents a focal length of the convex portion of the effective mirror; and
$\Phi_{Max}$ represents a maximal phase retardation.

2. The VCSEL of claim 1, wherein the active region comprises one or more quantum wells or one or more quantum dots.

3. The VCSEL of claim 1, wherein the second reflector comprises a distributed Bragg reflector located at a side opposite of the active region relative to the first reflector.

4. The VCSEL of claim 1, further comprising an insulating layer disposed between the first reflector and the second reflector, the insulating layer defining an aperture aligned coaxially with the axis of the VCSEL.

5. The VCSEL of claim 4, wherein the first reflector is circularly symmetric and is coaxially aligned with the aperture.

6. The VCSEL of claim 1, wherein the first reflector comprises a structuration associated with an epitaxial distributed Bragg reflector.

7. The VCSEL of claim 1, wherein the focal length f of the concave portion is equal to or greater than 5 μm and equal to or less than 20 μm; and wherein the focal length f' of the convex portion is equal to or greater than 10 μm and equal to or less than 100 μm.

8. The VCSEL of claim 1, wherein the first reflector is disposed on a confinement layer for the active region.

9. A vertical cavity surface emitting laser (VCSEL) comprising:
an active region configured to be electrically pumped such that the active region generates light having a fundamental mode and a higher order mode; and
an optical cavity having the active region and being bounded by:
a distributed Bragg reflector; and
a first reflector comprising a plurality of parts concentrically arranged around an axis of symmetry A of the VCSEL, each concentric part having a spatial variation that changes at distances from the axis of symmetry A, the concentric parts configured to exhibit a phase retardation Φ as a function of a radius r relative to the axis of symmetry A such that:
within a radius r0 of the axis of symmetry A, the concentric parts are structured to present a concave portion of an effective mirror to the active region, reflect the fundamental mode such that a stability of the fundamental mode is increased within the optical cavity, and exhibit a phase retardation Φ(r) given by $$\Phi(r) = \frac{2\pi}{\lambda}\left(f + \frac{\lambda}{2\pi}\Phi_{Max} - \sqrt{r^2 + f^2}\right) \text{Mod } 2\pi$$

outside the radius r0 from the axis of symmetry A, the concentric parts are structured to present a convex portion of the effective mirror to the active region, diverge the higher order mode, and exhibit a phase retardation Φ(r) given by $$\Phi(r) = \frac{2\pi}{\lambda}\left(f' + \frac{\lambda}{2\pi}\Phi_{Max} - \sqrt{r^2 + f'^2}\right) \text{Mod } 2\pi$$

λ represents a wavelength of the fundamental mode in a vacuum;
f represents a focal length of the concave portion of the effective mirror;
f' represents a focal length of the convex portion of the effective mirror; and
$\Phi_{Max}$ represents a maximal phase retardation.

10. The VCSEL of claim 9, further comprising an insulating layer located within the optical cavity, the insulating layer defining an aperture aligned coaxially with the axis of the VCSEL.

11. The VCSEL of claim 10, wherein the first reflector is circularly symmetric and is coaxially aligned with the aperture.

12. The VCSEL of claim 9, wherein the active region comprises one or more quantum wells or one or more quantum dots.

13. The VCSEL of claim 9, wherein the focal length f of the concave portion is equal to or greater than 5 micrometers and equal to or less than 20 micrometers; and wherein the focal length f' of the convex portion is equal to or greater than 10 micrometers and equal to or less than 100 micrometers.

14. The VCSEL of claim 9, wherein the first reflector comprises an epitaxial distributed Bragg reflector (DBR) associated therewith.

15. The VCSEL of claim 9, wherein the first reflector is disposed on a confinement layer for the active region.

16. A method of fabricating a vertical cavity surface emitting laser (VCSEL), the method comprising, not necessarily in sequence, the steps of:
  forming a first reflector by:
    forming a distributed Bragg reflector; and
    forming a structuration for a reflector adjacent the distributed Bragg reflector;
  forming an optical cavity adjacent the first reflector, the optical cavity having an active region configured to be electrically pumped such that the active region generates light having a fundamental mode and a higher order mode; and
  forming a second reflector adjacent the optical cavity by concentrically arranging a plurality of parts around an axis of the VCSEL, each concentric part having a spatial variation that changes at distances from the axis of the VCSEL, with:
    (i) a central portion of the parts located about the axis of the VCSEL to present a concave portion of an effective mirror to the active region and configuring the central portion to reflect the fundamental mode such that a stability of the fundamental mode is increased within the optical cavity, and
    (ii) a peripheral portion of the parts spaced apart from the axis of the VCSEL to present a convex portion of the effective mirror to the active region and configuring the peripheral portion to diverge the higher order mode.

17. The method of claim 16, wherein forming the second reflector comprises at least one of:
  forming a structuration for the second reflector on a confinement layer of the optical cavity; and
  forming a distributed Bragg reflector adjacent a confinement layer of the optical cavity, and forming a structuration for the second reflector adjacent the distributed Bragg reflector.

* * * * *